United States Patent [19]

Serev

[11] Patent Number: 4,989,001
[45] Date of Patent: Jan. 29, 1991

[54] MICROCONTROLLER BASED RESOLVER-TO-DIGITAL CONVERTER

[75] Inventor: Peter G. Serev, Woodbury, Conn.

[73] Assignee: Advanced Micro Controls, Inc., Washington Depot, Conn.

[21] Appl. No.: 340,855

[22] Filed: Apr. 20, 1989

[51] Int. Cl.$^5$ ............................................. H03M 1/48
[52] U.S. Cl. ..................................... 341/116; 318/661
[58] Field of Search ....................... 341/112, 115, 116; 318/660, 661

[56] References Cited

U.S. PATENT DOCUMENTS

| | | | |
|---|---|---|---|
| 3,990,062 | 11/1976 | Miller et al. | 341/116 |
| 4,010,463 | 3/1977 | Kay | 341/116 |
| 4,099,245 | 7/1978 | Maysonett | 341/116 |
| 4,134,106 | 1/1979 | Hungerford | 318/661 |
| 4,282,468 | 8/1981 | Barker et al. | 318/661 |
| 4,375,636 | 3/1983 | Stack et al. | 341/116 |
| 4,511,885 | 4/1985 | Serev et al. | |
| 4,527,120 | 7/1985 | Kurosawa | 341/115 |

OTHER PUBLICATIONS

Brochure of Advanced Micro Controls, Inc. dated 5/88 and entitled "Third Generation Programmable Limit Switch-The Obvious Choice".
Data Sheet of Advanced Micro Controls, Inc. entitled "iPCE-1 Intelligent Programmable Controller Encoder", undated.

Primary Examiner—William M. Shoop, Jr.
Assistant Examiner—Marc S. Hoff
Attorney, Agent, or Firm—Cooper & Dunham

[57] ABSTRACT

Disclosed is a microcontroller based Resolver-to-Digital converter in which synchronous sample-and-hold type demodulation is used with an optimum time of the sample-and-hold established by control of the phase and the magnitude of the reference voltage supplied to the resolver as a function of the resolver's electrical characteristics, thus minimizing the quadrature and the even harmonics effects which are a byproduct of the resolver. The demodulated resolver outputs are filtered and are converted to digital form with the use of an A/D converter integral or external to the microcontroller. The magnitude of the reference voltage is set to an optimum value in order to utilize the full range of the A/D converter. Using digital signal processing techniques and known trigonometric identities the shaft angle of the resolver is extracted from the A/D outputs and supplied to the output latches in continuous or bus controlled fashion. This method is further expended to cover the use of the R/D converter with multiple resolvers.

20 Claims, 3 Drawing Sheets

MICROCONTROLLER BASED RESOLVER-TO-DIGITAL CONVERTER

BACKGROUND AND SUMMARY OF THE INVENTION

The invention is in the field of measuring angular displacements and utilizing the resulting measurements in equipment such as in programmable limit switches and programmable controllers. More specifically the invention pertains to using resolvers to convert an angular displacement of a shaft to an analog electrical signal that carries information about such angular displacement, and further pertains to converting the analog signal to a digital signal for use in control functions, as used in Resolver-To-Digital (R/D) conversion. An example of a prior use of a resolver in a similar context is discussed in U.S. Pat. No. 4,511,884 naming the inventor herein as a coinventor. One example of a programmable limit switch utilizing a resolver is the iPLC-1 model available from Advanced Micro Controls, Inc., Route 47, Washington Depot, CT 06794, discussed in a brochure dated 5/88 and a data sheet which are hereby incorporated by reference in this specification.

A resolver can be the transducer of choice particularly in harsh environment such as in manufacturing plants because it tends to be reliable and stable and is unaffected by the typically encountered changes in voltage, frequency, temperature and aging. A resolver typically has a rotor on a shaft which is mechanically coupled to undergo the angular displacement of interest. The rotor carries a reference winding and rotates in a stator which typically has a pair of output windings which are spatially at an angle to each other. Typically, the rotor winding is excited with a sinusoidal reference voltage, which induces in the stator windings a pair of sinusoidally varying voltages which are at the frequency of the reference voltage but tend to be delayed in phase relative to the reference sine wave and have amplitudes proportional respectively to the sine and cosine of the angular position of the rotor relative to the stator. The ratio of these two voltages in the output windings corresponds to the tangent of the angular position of the rotor relative to the stator, and this ratio can be digitized and used, e.g., for control functions. The resolver's output waveforms can be measured using the synchronous sample-and-hold approach, in which they are sampled at their peaks in sync with the reference voltage and the sampled voltages are held until the next sample period. The samples can be used as a representation of the demodulated resolver output.

The accuracy of resolvers can be adversely affected by quadrature effects (leakage of the sine wave output into the cosine wave output) and second harmonics voltages. To reduce such undesirable effects, an effort can be made to place the sample period exactly at the 90 degree point of the resolver's sinusoidally shaped output waveform. However, where this point is depends on the individual characteristics of a resolver and can vary due to manufacturing tolerances and other factors. Accordingly, this approach requires knowledge of the transfer function of the particular resolver, derived for example by individually testing R/D converters in the manufacturing process or in the field. Needless to say, this has been an undesirable burden in the manufacture and servicing of R/D converters.

This invention takes a different approach. In accordance with the invention an R/D converter need not depend on post-manufacture or post-service tests and adjustments of discrete components in order to accommodate the transfer function of the particular resolver used. Instead, an R/D converter in accordance with the invention inherently accommodates relatively wide variations in the transfer functions of resolvers and still functions accurately. Specifically, upon power up an R/D converter in accordance with the invention first determines by itself the correct time to sample the resolver's outputs based on the relevant characteristics of the resolver in the circuit and only then commences using the resolver's outputs to measure shaft angle. In addition, an R/D converter in accordance with the invention further improves accuracy by adjusting the amplitude of the reference wave to ensure that the amplitude of the output waveforms would be just within the dynamic range of the analog-to-digital (A/D) converter which is a part of the R/D converter.

In an exemplary and nonlimiting embodiment of the invention, the resolver's reference winding is driven with a reference sine wave derived by filtering and power amplifying a reference square wave produced by an integrated circuit (IC) microcontroller such as from the Intel MCS-96 family, the TI TMS320C14 family, the Motorola 68HC11 family, or a similar device. A characteristic of such microcontrollers is that they have a High-Speed Input/Output (HSI/O) device as a part of the IC, which can measure time intervals between signal transitions on designated High-Speed (HS) inputs and can change the state on designated HS outputs at programmed time intervals without the intervention of the CPU which is a part of the same IC.

In accordance with the invention, upon power up the R/D converter first adjusts itself to the transfer function of the resolver and only then starts its normal operation of measuring angular displacement. To this end, the converter drives the resolver with the reference sine waveform derived from the HS output of the microcontroller, which sine waveform has a known frequency but an unknown phase relative to the reference square wave. The circuit responds to the crossing of a reference voltage line (e.g., zero voltage) by this reference sine waveform to find the phase delay of the reference sine waveform relative to the reference square wave. The circuit then uses this phase difference to calculate the 90 degree point on the reference sine wave, using as a part of this calculation the known common frequency of the square and sine reference waves. The circuit then finds when the larger of the sine and cosine output waves of the resolver crosses a reference voltage (e.g., zero volts) and on that basis as well as on the basis of the known common frequency of the reference waves and the resolver output waves, computes the phase difference or delay between the reference sine wave and the larger output wave and on that basis determines the 90 degree point at which the resolver output waves should be sampled to avoid or at least reduce undesirable quadrature and second harmonic effects. Further, the R/D converter in accordance with the invention controls the amplitude of the reference sine wave such that the resolver's output waves would have amplitudes that use the full range of the analog-to-digital (A/D) converter which digitizes these waves, to further improve accuracy. In an alternate embodiment, the principles of the invention are used in an R/D converter that uses a single microcontroller IC connected to multiple resolvers. The goal in such a multiple resolver R/D converter is to have the single microcontroller find and use a resolver transfer function parameter that can accommodate all of the resolvers which are a part of the converter, which is practical when the resolvers are sufficiently close though not identical in their relevant transfer function parameters.

DETAILED DESCRIPTION

Figure 1:
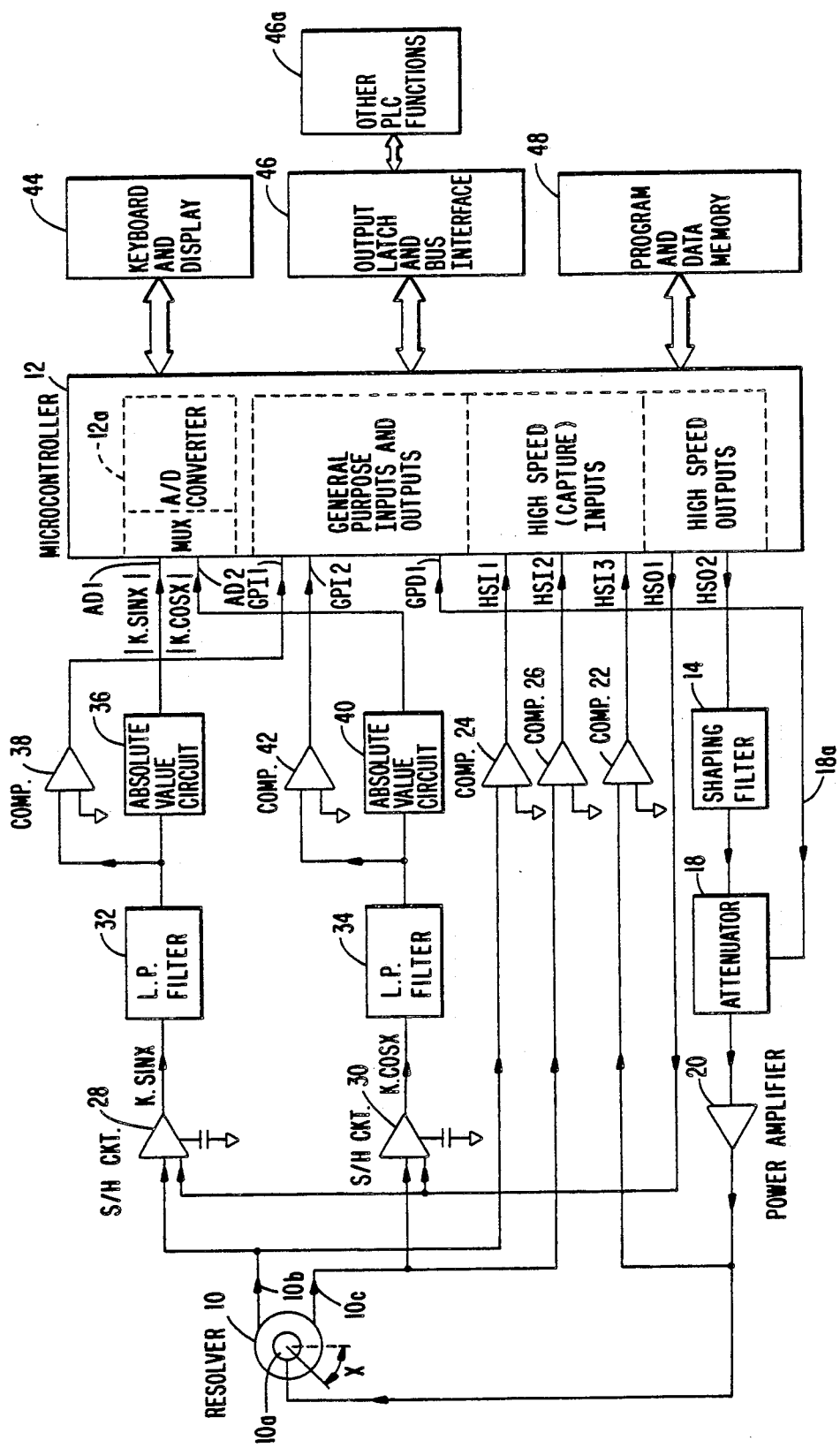
FIG. 1 is a partly schematic and partly block diagram of an embodiment of the invention using a single resolver.
Figure 2:
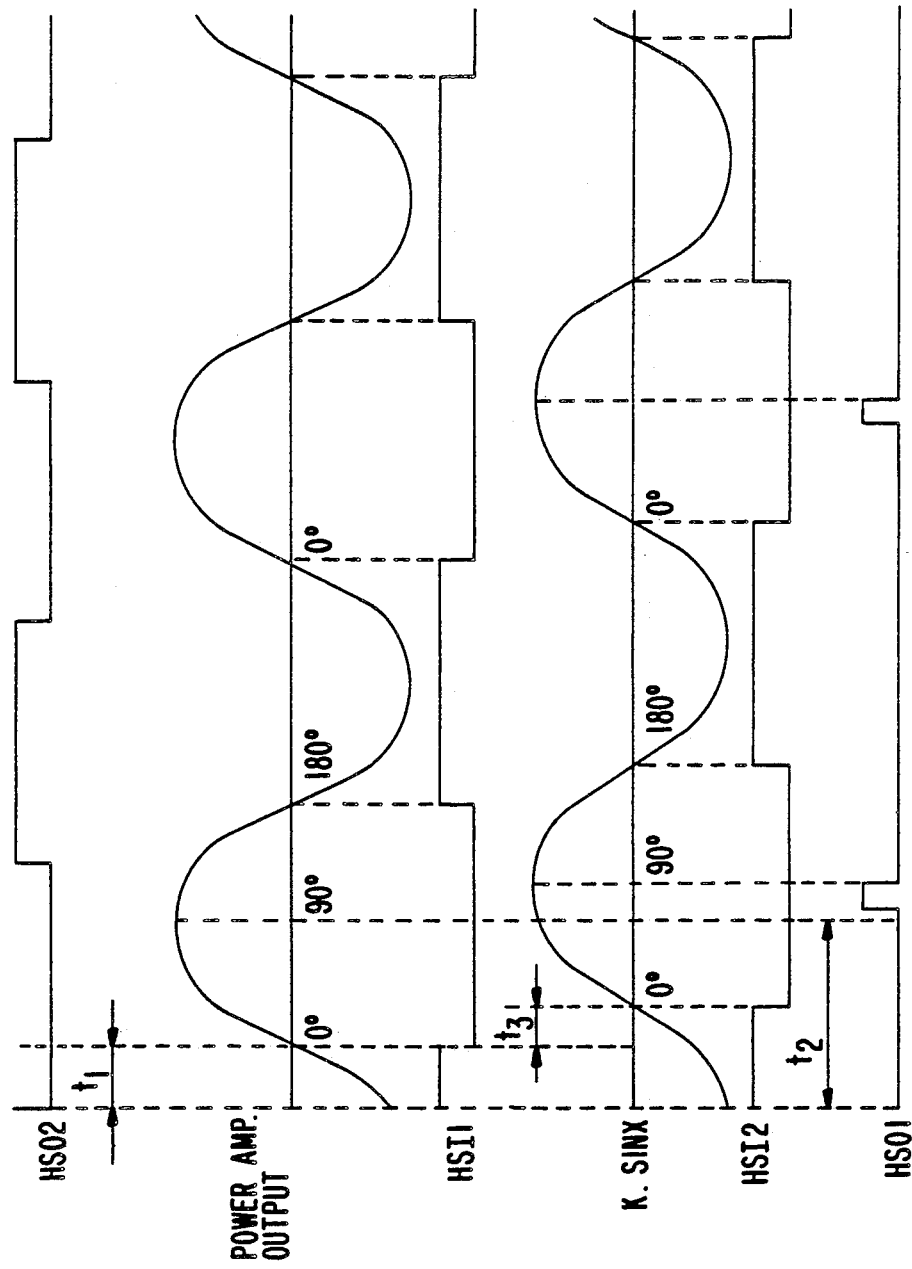
FIG. 2 is a timing diagram of signals generated in the circuit of FIG. 1.

FIG. 1 shows a single resolver R/D converter which, in accordance with the invention, upon power up first adjusts itself to the relevant parameter of the resolver's transfer function and only then starts to measure the angular displacement of the resolver shaft. The reference (rotor) winding 10a of a resolver 10 is driven with a reference sinusoidal waveform which is illustrated in the part of FIG. 2 labelled POWER AMP OUTPUT. This reference sine wave is derived by programming a microcontroller 12, which can be one of the IC's previously identified, to provide the reference square wave illustrated at HS02 in FIG. 2. This reference square wave is provided at the microcontroller's HS output labelled HS02 and has a frequency selected to be in the range of 2,500–5,000 Hz. It is applied to a shaping filter 14 which in response provides at its output a sine wave with a known constant amplitude. This sine wave from shaping filter 14 is fed to an attenuator 18 which attenuates it by a factor determined by commands received thereby from general purpose output GP01 of microcontroller 12 over a control line 18a. The sine wave attenuated by attenuator 18 is fed to a power amplifier 20 which in turn provides a reference sine wave having the power needed to drive the reference winding 10a of resolver 10. The frequency of the reference sine wave is known, as it is the same as that of the reference square wave provided by microcontroller 12 at output HS02. However, the phase delay of the reference sine wave relative to the reference square wave is unknown. In order to find this phase delay, which is illustrated at t1 in FIG. 2, the reference sine waveform provided by power amplifier 20 also is fed to one of the inputs of a comparator 22 whose other input is referenced to ground (0 volts). In this configuration the output of comparator 22 changes state every time the output of power amplifier 20 crosses the 0 volt level. The output of comparator 22 feeds one of the High-Speed (or capture) inputs of microcontroller 12, namely HSI3. Thus, microcomputer 12 has information as to the transition times of the reference square wave that it provides at output HS02 and has information of the zero cross at input HSI3 and, by being programmed in a manner which is known in the art once the purpose is specified, calculates both the phase delay t1 and the period designated t2 in FIG. 2. This period t2 is the sum of the phase delay t1 and the time for a quarter wavelength of the reference square wave from output HS02. Time period t2 specifies the 90 degree point of the reference sine wave supplied to the reference winding 10 of resolver 10.

The outputs of the two resolver stator windings, provided at output terminals 10b and 10c, are sinusoidal waves whose frequency is the same as that of the reference square wave and the reference sine wave but which are delayed relative to the reference sine wave by an unknown delay that depends on the individual transfer function of the particular resolver that is used. The output sine wave is illustrated at FIG. 2 and is labelled there [k.sin x]. As seen in FIG. 2, there is a phase delay t3 between the reference sine wave and the output sine wave. In order to determine this phase delay t3, which is required for optimum sampling of the resolver's outputs, the sinusoidal output waves at resolver outputs 10b and 10c are supplied through comparator circuits 24 and 26, respectively, to two other High-Speed (capture) inputs of microcontroller 12, namely, HSI1 and HSI2. The same output terminals 10b and 10c also feed the inputs of sample-and-hold (H/S) circuits 28 and 30, respectively, and the sample period of each of these H/S circuits 28 and 30 is controlled by High-Speed output HS01 of microcontroller 12. The outputs of S/H circuits 28 and 30 are filtered by low-pass filters 32 and 34, respectively, to prevent or reduce aliasing, and the filtered output from 32 is fed to absolute value amplifier 36 and comparator 38 while the filtered output from 34 is fed to a similar combination of an absolute value amplifier 40 and comparator 42. The outputs of absolute value circuits 36 and 40 are fed to analog inputs AI1 and AI2 of a multiplexed analog-to-digital (A/D) converter 12a, which is a part of microcontroller 12 (an exemplary preferred embodiment uses an Intel 80C196 chip), while the outputs of comparators 38 and 42 are fed to respective general purpose inputs GPI1 and GPI2 of microcontroller 12. Absolute value amplifiers 36 and 40 are used in this case because the internal A/D converter 12a is not capable of handling bipolar signals. Comparators 38 and 42 therefore are referenced to 0 volts and work as 1-bit A/D converters to provide information regarding the polarity of the outputs of absolute value circuits 36 and 40, respectively, so that these outputs can be processed as discussed below. If an external multiplexed A/D converter capable of digitizing bipolar signals is used in place of internal converter 12a, absolute value circuits 36 and 40 and their associated comparators 38 and 42 can be omitted. Microcomputer 12 uses the digitized values of the two resolver output waves to find which is greater in value, and uses the higher valued output wave to compute the phase delay t3 on the basis of the time difference between the square waves at input HSI3 and either HSI1 or HSI2, depending on which of HSI1 and HSI2 corresponds to the higher valued resolver output wave. Microcontroller 12 then uses the time delay t3 to adjust the pulse at its output HS01 such that the drop in that pulse would be at the 90 degree point of the resolver output waves, and supplies this HS01 output to S/H circuits 28 and 30 to sample the resolver output waves at the right times so as to avoid or reduce quadrature and second harmonic effects. In addition, as discussed in greater detail below, in the course of this self-setting process microcontroller 12 adjusts the attenuation factor of attenuator 18 such that the higher valued output wave of resolver 10 is just within the dynamic range of A/D converter 12a, to thereby prevent errors due to exceeding the relevant dynamic range while at the same time improving accuracy by using the entire dynamic range.

Microcontroller 12 is connected to a keyboard and display unit 44, through which it can be programmed and otherwise controlled, to an output latch and interface 46 for interacting with other equipment, and to a typically nonvolatile program and data memory 48, all of which can be used in the manner known in the art to interact with microcontroller 12. Unit 46 can be connected to other typical components and options of a programmable limit switch or a similar device, as generally shown at unit 46a in FIG. 1.

In operation, when the system is powered it first adjusts itself to the relevant parameter of the transfer function of resolver 10, which can differ as between resolvers, and only then starts measuring the angular displacement of rotor winding 10 relative to stator windings 10b and 10c. Thus, in this self-adjusting:

1. Microprocessor 12 generates at its output HS02 a square wave which has a preprogrammed frequency and is illustrated at HS02 in FIG. 2;
2. Shaping filter 14 converts this square wave to a sine wave having a known amplitude but having an unknown phase delay relative to the square wave;
3. Digital signals from output GP01 of programmed microcontroller 12 initially set attenuator 18 to 0 dB loss.
4. Programmed microcontroller 12 uses the signal received at input HSI3 to compute the phase delay of shaping filter 14, illustrated at t1 in FIG. 2. Then microcontroller 12 computes the time t2, illustrated in FIG. 2, of the sample pulse referenced to the square wave HS02, and programs output HS01 to start outputting the timing signal illustrated at HS01 in FIG. 2.
5. The outputs 10b and 10c of resolver 12 are then consecutively digitized at 12a and the resulting values are stored in microcontroller 12. These values represent the orthogonal coordinates of a vector with magnitude:

$$M = [(k \sin x)^2 + (k \cos x)^2]^{\frac{1}{2}} = k$$

where k is the maximum amplitude of the resolver outputs and x is the shaft angle;

6. Microcontroller 12 then uses the signal at HSI1 or HSI2 corresponding to the greater of the two digitized values, to compute the phase shift t3 introduced by resolver 10 and generates at output HS01 the correction to the placement of the sample pulse needed to sample exactly at the 90 degree point of the resolver output waves;
7. Microcontroller 12 consecutively digitizes the outputs 10b and 10c of resolver 10 and uses the resulting digital values to calculate the value M and to compare said value M to the range of A/D converter 12a. If M is greater or equal to the range of A/D converter 12a, microcontroller 12 sets attenuator 18 to introduce a predetermined loss and the procedure is repeated until the value of M is less than the range of A/D converter 12a;
8. As an option, microcontroller 12 can carry out more precise adjustment of the magnitude of the reference voltage by adjusting the pulsewidth of the square wave signal on HS02; and
9. With the magnitude and phase of the reference and output waves determined and the relevant values stored, the system switches to a normal mode of operation.

In normal mode of operation, at predetermined intervals or on demand from external sources synchronized to the sample intervals, outputs 10b and 10c of resolver 10 are digitized and compared to each other. The result of the comparison and the polarity of the two outputs are used to determine the three most significant bits of the resolver's shaft position in a manner known in the art of resolvers and R/D converters. Two methods can be used to calculate the position of a resolver shaft with a predetermined accuracy:

a. Using the trigonometric identities:

$$\tan x = (k. \sin x)/(k. \cos x)$$

or $$\cotan x = (k. \cos x)/(k. \sin x)$$

where the numerator is the lower of the two output values of the resolver. The shaft angle of the resolver can be found from a table containing the $[-1 \tan x]$ values or calculated by approximation formulas; or b. The value of M can be periodically calculated and the lower of the two resolver outputs scaled using the formulas:

$$\sin x = [(k. \sin x). (2^n)]/M$$

or $$\cos x = [(k. \cos x). (2^n)]/M$$

where $2^n$ is the range of the A/D converter.

The shaft angle of the resolver can be found from a table containing the $[-1 \sin x]$ values or calculated by approximation formulas.

The values calcualted by the above methods are appended to the three most significant bits found previously to form a number representing the angle of the resolver shaft of $2^{(n+2)}$.

Figure 3:
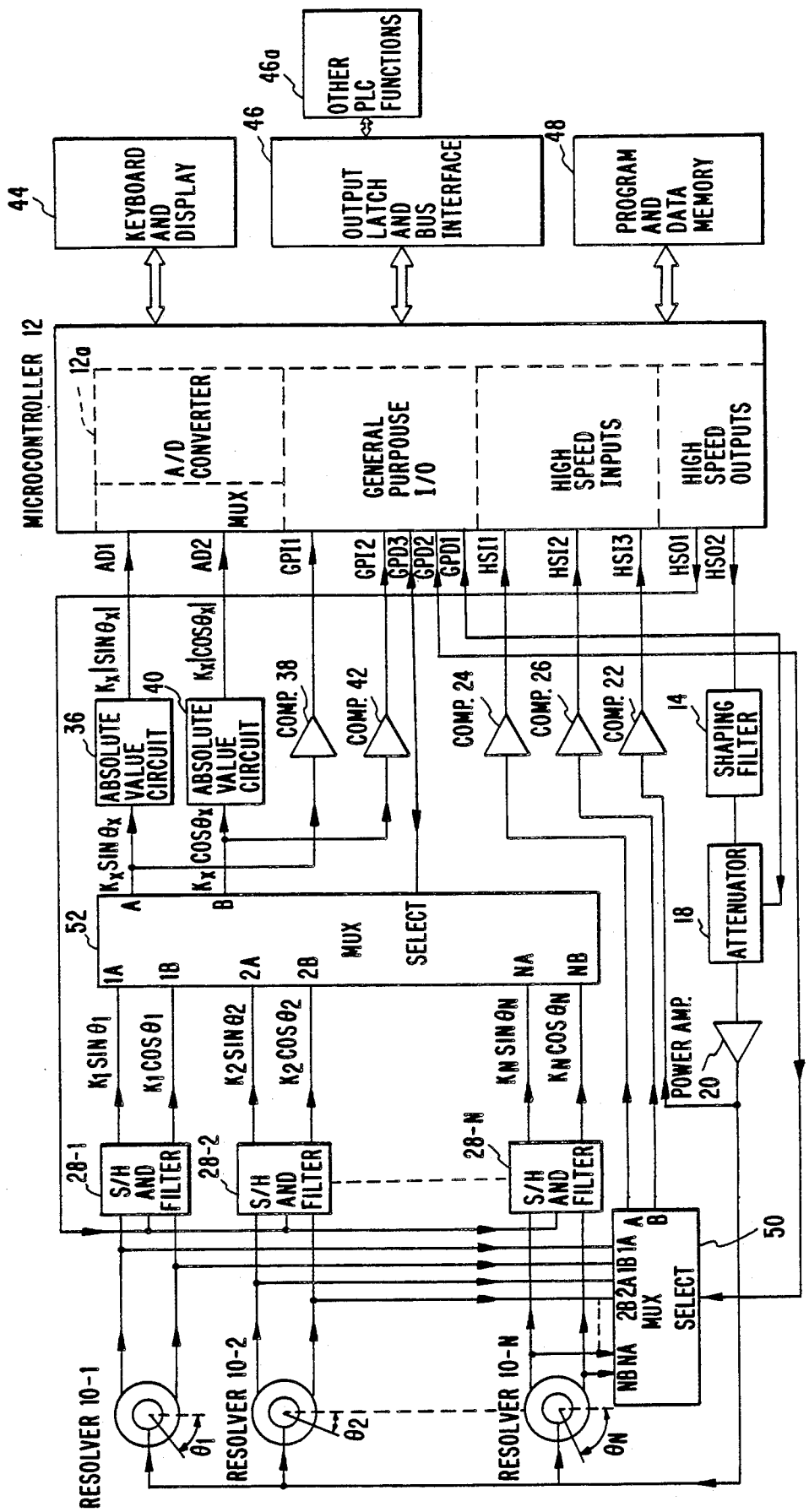
FIG. 3 is a partly schematic and partly block diagram of an embodiment of the invention using multiple resolvers.

FIG. 3 illustrates an alternate embodiment, multi-resolver embodiment of the invention shown in FIG. 1, and like elements bear like reference numerals and need not be described again. In FIG. 3 each of resolves 10-1 through 10-N is similar to resolver 10 but the multiple resolvers connected to the single microcontroller 12 need not be identical. While they cannot differ greatly from each other in transfer function, it is believed that typically resolvers from the same manufacturer, or at least from the same batch or from a batch of selected resolvers, can be used as described below. In FIG. 3, the added component are multiplexers (MUX) 50 and 52 connected as shown and driven by control signals provided by microcontroller 12 at outputs GPO2 and GPO3 respectively. In the preliminary procedure of adjusting the system to the transfer functions of the resolvers, microcontroller 12 selects resolver 10-1 through 10-N in sequence through MUX 50 and MUX 52 and derives and stores the times t1, t2, and t3, as well as the value M, for each resolver, using the same procedure as discussed for resolver 10 in connection with FIG. 1. Note that in FIG. 3 each of blocks 28-1 through 28-N represents the same circuit as the combination of a sample-and-hold circuit 28 and a low pass filter in FIG. 1. Microcontroller 12 then computes the placement of the sampling pulse provided at its output HSO1 based on averaging of the times t2 and t3 of resolver 10-1 through 10-N, sets the magnitude of the reference sine wave (through control signals at output GPO1, applied to attenuator 18) on the basis of the output of the resolver having the highest value of M. If desired, microprocessor 12 can compare the sampling time and M values of each of resolvers 10-1 through 10-N with a threshold value, e.g., with the average plus a selected tolerance, and identify any resolver that does not meet the test. The system of FIG. 3 then goes to an angle measuring mode, selecting in sequence each of resolvers 10-1 through 10-N and using the same angle measuring process as for resolver 10 in FIG. 1. Thus, the features of the FIG. 3 circuit in which it differs from the FIG. 1 circuit are:

1. All of resolvers 10-1 through 10-N are interrogated in sequence, generally in the manner used in the FIG. 1 system, and an average value of the phase shift introduced by the resolvers is computed as a correction to the placement of the sample pulse; and
2. The value M is calculated for each resolvers 10-1 through 10-N and the resolver with highest value of M is used when adjusting the magnitude of the reference sine wave.

The R/D system and method described above provide a number of advantages, including:

1. The system substanitally removes the disadvantages of improperly placing the sample pulse previously associated with the synchronous sample-and-hold method of R/D conversion;
2. The use of a microcontroller of the specified type in the invented manner allows many other functions to be added to the system;
3. The direct access to resolver outputs allows the incorporation of diagnostics such as detection of a break in the cable connecting the resolver to the R/D converter and malfunctioning of the resolver itself; and
4. As shown the circuit is particularly well suited for use with multiple resolvers.

I claim:

1. A resolver-to-digital converter comprising:
a resolver having a reference winding and first and second output windings;
a microcontroller having an A/D converter and a high-speed input/output section having first through third high-speed inputs and first and second high-speed outputs, said microcontroller generating at said second high-speed output a reference square wave having a selected frequency;
a shaping filter receiving said reference square wave and in response generating an initial sine wave which has the same selected frequency but is delayed in phase relative to the reference square wave, and a modulating circuit which receives said sine wave, applies a selected modulation thereto to generate a reference sine wave and drives said reference winding of said resolver with said reference sine wave to thereby cause said first and second winding to output respective first and second optput waves which have said selected frequency but are delayed in phase relative to said reference sine wave;
a first detection circuit detecting the crossing of a selected reference by said first output wave and supplying information regarding said crossing to said first high-speed input of said microcontroller, a second detection circuit detecting the crossing of a selected reference by said second output wave and supplying information regarding said crossing to said second high-speed input of said microcontroller, and a third detection circuit detecting the crossing of a selected reference by said reference sine wave and supplying information regarding said crossing to said third high-speed input of said microcontroller;
first and second sampling circuits which sample said first and second output waves, respectively, and supply respective samples to said A/D converter of said microcontroller for conversion thereof into digital values;
wherein said microcontroller uses said information supplied thereto at said first through third high-speed inputs to compute the phase delay of said first and second output waves and to provide at said first high-speed output a sampling signal applied to said sampling circuits to cause said sampling circuits to sample said first and second output waveforms at or about the 90 degree point and provide the resulting samples to said A/D converter, to thereby avoid or reduce quadrature and second harmonic effects.

2. A resolver-to-digital converter as in claim 1 in which said microcontroller has a control output coupled to said modulating circuit and is responsive to said samples to provide at said control output a control signal causing said modulating circuit to adjust the amplitude of said reference sine waveform such that the amplitude of the greater of said first and second output signals matches the dynamic range of said A/D converter.

3. A resolver-to digital converter comprising:
a resolver having a reference winding and first and second output windings;
a microcontroller circuit comprising an A/D converter and a high-speed input/output section having first through third high-speed inputs and first and second high-speed outputs, said microcontroller circuit generating at said second high-speed output a reference square wave having a selected frequency;
a processing circuit receiving said reference square wave and in response generating a reference sine wave which has a known frequency and a known phase relative to the reference square wave and driving said reference winding of said resolver with said reference sine wave to thereby cause said first and second winding to output respective first and second output waves which conform to said known frequency but differ in phase from the reference sine wave;
a detection circuit detecting the crossing of a selected reference by at least one of said first and second output waves and supplying information regarding said crossing to respective one of said first and second high-speed inputs, and a third detection circuit detecting the crossing of a selected reference by said reference sine wave and supplying information regarding said crossing to said third high-speed input;
first and second sampling circuits which sample said first and second output waves, respectively, and supply respective samples to said A/D converter of said microcontroller circuit for conversion of said samples into digital values;
wherein said microcontroller circuit comprises circuits using the information supplied to said first and/or second high-speed input and to said third high-speed input to compute a time interval related to a phase difference between at least one of said first and second output waves and said reference sine wave and to provide at said first high-speed output a sampling signal applied to said sampling circuits to cause said sampling circuits to sample said first and second output waveforms at or about the 90 degree point and provide the resulting samples to said A/D converter.

4. A resolver-to-digital converter as in claim 3 in which said microcontroller circuit comprises a single-chip microprocessor.

5. A resolver-to-digital converter as in claim 4 in which said processing circuit comprises a shaping filter which converts the reference square wave ito a sine wave.

6. A resolver-to-digital converter as in claim 5 in which said processing circuit comprises a modulator which applies a selected modulation to the sine wave into which the shaping filter converts the reference square wave in order to generate said reference sine wave which drives said reference winding, said modulation causing the output sine waves to match the dynamic range of the A/D converter.

7. A resolver-to-digital converter as in claim 6 in which said detection circuit includes a respective detection circuit for detecting when each of the first and second output waves crosses the reference and for supplying information regarding the crossing of the reference by the first output wave to the first high-speed input and for supplying information regarding the crossing of the reference by the second output wave to the second high-speed input, and wherein the microcontroller circuit uses information from both of said first and second detection circuits to compute said time interval related to said phase difference.

8. A resolver-to-digital converter as in claim 7 including a number of separate resolvers, each having a reference winding and first and second output windings, and including a circuit for successively connecting each resolver to said microporcessor circuti to compute and store respective time intervals related to the phase differences pertaining to the respective resolvers, and wherein said microporcessor circuit uses said stored time intervals to generate respective sampling signals to sample the first and second output waves of the respective resolvers at or about the respective 90 degree points of said output waveforms.

9. A resolver-to-digital converter as in claim 3 in which said processing circuit comprises a shaping filter which converts the reference square wave into a sine wave.

10. A resolver-to-digital concerter as in claim 9 in which said processing circuit comprises a modulator which applies a selected modulation to the sine wave into which the shaping filter converts the reference square wave i order to generate said reference sine wave which drives said reference winding, said modulation causing the output sine waves to match the dynamic range of the A/D converter.

11. A resolver-to-digital converter as in claim 10 including a number of separate resolkvers, each havign a reference winding and first and second output windings, and including a circuit for successively connecting each resolver to said microprocessor circuit to compute and store respective time intervals related to the phase differences pertaining to the respective resolvers, and wherein said microprocessor circuit uses said stored time intervals to sample the first and second output waves of each of said resolvers at or about the respective 90 degree points.

12. A resolver-to-digital converter as in claim 3 including a number of separate resolvers, each having a reference winding and first and second output windings, and including a circuit for connecting the resolvers to said microprocessor circuit to compute and store respective time intervals related to the phase differences pertaining to the respective resolvers, and wherein said microprocessor circuit uses said stored time intervals to sample the first and second output waves of each of said resolvers at or about the respective 90 degree points.

13. A resolver-to-digital converter as in claim 3 in which said processing circuit comprises a modulator which modulates said reference sine wave to cause the output sine waves to match the dynamic range of the A/D converter.

14. A resolver-to-digital converter as in claim 3 in which said resolver has a shaft and including a circuit using said digital values of the samples of said output sine waves to compute the angular position of the resolver shaft and to utilize the computed angular position.

15. A method comprising:
providing a resolver having a reference winding and first and second output windings;
generating a reference square wave having a selected frequency;
converting said reference square wave into a reference sine wave which has a known frequency and a known phase relative to the reference square wave and driving said reference winding of said resolver with said reference sine wave to cause said first and second windings to output respective first and second output waves which conform to said known frequency but differ in phase from the reference sine wave;
detecting the crossing of a selected reference by at least one of said first and second output waves and the crossing of a selected reference by said reference sine wave and generating information regarding said crossings;
using the information supplied at said at least one of first and second high-speed inputs and at said third high-speed input to compute at least one time interval related to a phase difference between at least one of said first and second output waves and said reference sine wave;
utilizing said time interval to generate a sampling signal related to about the 90 degree points of said output sine waves; and
sampling said first and second output waves in accordance with said sampling signal and converting the samples into digital values.

16. A method as in claim 15 including modulating the reference sine wave to cause the output waves to match the dynamic range of the A/D converter.

17. A method as in claim 16 in which the detecting step comprises detecting the crossing of a selected reference by each of said first and second output waves and generating information regarding said crossings, and the using step comprises using information regarding the crossing of the reference by each of said output waves to compute said at least one time interval related to said phase difference.

18. A method as in claim 17 in which the providing step comprises providing a number of separate resolvers, each having a respective reference winding and respective first and second output windings and sequentially applying said detecting and using steps to the output waves of the respective resolvers in order to compute respective time intervals related to phase differences pertaining to the respective resolvers, and storing said time intervals and applying said utilizing and sampling steps to the respective resolvers by using said stored time intervals to sample the first and second output waves of the respective resolvers at or about the respective 90 degree points of the respective output waves.

19. A method as in claim 15 in which the detecting step comprises detecting the crossing of a selected reference by each of said first and second output waves and generating information regarding said crossings, and the using step comprises using information regarding the crossing of the reference by each of said output waves to compute two time intervals related to phase differences.

20. A method as in claim 15 in which the providing step comprises providing a number of separate resolvers, each having a respective reference winding and respective first and second output windings and sequentially applying said detecting and using steps to the output waves of the respective resolvers in order to compute respective time intervals related to phase differences pertaining to the respective resolvers, and storing said time intervals and applying said utilizing and sampling steps to the respective resolver by using said stored time intervals to sample the first and second output waves of the respective resolvers at or about the respective 90 degree points of the respective output waves.

* * * * *